United States Patent
Ni et al.

(10) Patent No.: US 7,768,785 B2
(45) Date of Patent: Aug. 3, 2010

(54) MEMORY MODULE ASSEMBLY INCLUDING HEAT-SINK PLATES WITH HEAT-EXCHANGE FINS ATTACHED TO INTEGRATED CIRCUITS BY ADHESIVE

(75) Inventors: Jim Chin-Nan Ni, San Jose, CA (US); Abraham C. Ma, Fremont, CA (US); Paul Hsueh, Concord, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 193 days.

(21) Appl. No.: 12/042,229

(22) Filed: Mar. 4, 2008

(65) Prior Publication Data
US 2008/0151487 A1    Jun. 26, 2008

Related U.S. Application Data

(63) Continuation-in-part of application No. 11/382,467, filed on May 9, 2006, now Pat. No. 7,365,985, which is a continuation-in-part of application No. 10/956,893, filed on Sep. 29, 2004, now Pat. No. 7,215,551.

(51) Int. Cl.
H05K 7/20    (2006.01)
H01L 23/36    (2006.01)

(52) U.S. Cl. .................. 361/715; 361/709; 361/710; 361/711; 361/720; 257/707

(58) Field of Classification Search ............. 361/707, 361/709–711, 715, 719, 728, 737, 720; 257/707
See application file for complete search history.

(56) References Cited

U.S. PATENT DOCUMENTS

| | | | |
|---|---|---|---|
| 4,606,962 A | * | 8/1986 | Reylek et al. ............... 428/148 |
| 5,109,318 A | | 4/1992 | Funari et al. |
| 5,313,097 A | | 5/1994 | Haj-Ali-Ahmadi et al. |
| 5,475,563 A | | 12/1995 | Donahoe et al. |
| 5,661,339 A | | 8/1997 | Clayton |
| 5,710,693 A | * | 1/1998 | Tsukada et al. .......... 361/679.32 |

(Continued)

FOREIGN PATENT DOCUMENTS

JP    2000251463 A    9/2000

(Continued)

*Primary Examiner*—Anatoly Vortman
(74) *Attorney, Agent, or Firm*—Bever, Hoffman & Harms, LLP; Patrick T. Bever

(57) ABSTRACT

A memory module assembly includes a heat-sink plate attached to one or more of the integrated circuits (e.g., memory devices) of a memory module PCBA by adhesive. The heat-sink plate includes an elongated base structure, a first contact plate extending away from the base structure such that a step-like positioning surface is defined therebetween, and heat-exchange fins extending from the opposite side of the base structure. An optional upper heat-sink plate is secured to a second side of the PCBA by a second adhesive layer, and contacts the lower heat-sink plate to facilitate heat transfer to the heat-exchange fins. The adhesive is either heat-activated or heat-cured. The adhesive is applied to either the memory devices or the heat-sink plates, and then compressed between the heat-sink plates and memory module using a fixture. The fixture is then passed through an oven to activate/cure the adhesive.

5 Claims, 13 Drawing Sheets

U.S. PATENT DOCUMENTS

| | | | |
|---|---|---|---|
| 5,731,633 A | 3/1998 | Clayton | |
| 5,751,553 A | 5/1998 | Clayton | |
| 5,793,609 A | 8/1998 | Donahoe et al. | |
| 5,892,660 A | 4/1999 | Farnworth et al. | |
| 5,896,274 A * | 4/1999 | Ishida | 361/737 |
| 5,966,287 A * | 10/1999 | Lofland et al. | 361/704 |
| 6,049,975 A | 4/2000 | Clayton | |
| 6,091,145 A | 7/2000 | Clayton | |
| 6,119,765 A * | 9/2000 | Lee | 165/80.3 |
| 6,232,659 B1 | 5/2001 | Clayton | |
| 6,297,961 B1 * | 10/2001 | Koizumi et al. | 361/720 |
| 6,343,020 B1 * | 1/2002 | Lin et al. | 361/816 |
| 6,353,538 B1 | 3/2002 | Ali et al. | |
| 6,362,965 B2 | 3/2002 | Bookhardt et al. | |
| 6,362,966 B1 * | 3/2002 | Ali et al. | 361/728 |
| 6,377,460 B1 | 4/2002 | Pohl et al. | |
| 6,424,532 B2 * | 7/2002 | Kawamura | 361/708 |
| 6,449,156 B1 | 9/2002 | Han et al. | |
| 6,661,661 B2 | 12/2003 | Gaynes et al. | |
| 6,775,139 B2 * | 8/2004 | Hsueh | 361/697 |
| 6,781,848 B2 | 8/2004 | Farnworth et al. | |
| 6,888,719 B1 * | 5/2005 | Janzen et al. | 361/679.31 |
| 7,023,700 B2 * | 4/2006 | Chiou et al. | 361/704 |
| 7,079,396 B2 | 7/2006 | Gates et al. | |
| 7,106,595 B2 | 9/2006 | Foster et al. | |
| 7,333,338 B2 * | 2/2008 | Lai et al. | 361/715 |
| 7,345,882 B2 * | 3/2008 | Lee et al. | 361/710 |
| 7,349,219 B2 * | 3/2008 | Lai et al. | 361/719 |
| 7,349,220 B2 * | 3/2008 | Lai et al. | 361/719 |
| 7,375,964 B2 * | 5/2008 | Lai et al. | 361/704 |
| 7,443,023 B2 * | 10/2008 | Wehrly et al. | 257/707 |
| 7,457,122 B2 * | 11/2008 | Lai et al. | 361/704 |
| 2002/0001180 A1 | 1/2002 | Kawamura | |
| 2002/0039282 A1 * | 4/2002 | Han et al. | 361/719 |
| 2002/0079117 A1 | 6/2002 | Coffin et al. | |
| 2003/0026076 A1 | 2/2003 | Wei | |
| 2003/0193788 A1 | 10/2003 | Farnworth et al. | |
| 2004/0130873 A1 * | 7/2004 | Hsueh | 361/697 |
| 2004/0250989 A1 | 12/2004 | Im et al. | 165/80.1 |
| 2005/0141199 A1 * | 6/2005 | Chiou et al. | 361/704 |
| 2005/0201063 A1 * | 9/2005 | Lee et al. | 361/715 |
| 2005/0276021 A1 | 12/2005 | Gates et al. | |
| 2006/0056154 A1 | 3/2006 | Foster et al. | |
| 2006/0203454 A1 * | 9/2006 | Chang | 361/707 |
| 2006/0268523 A1 * | 11/2006 | Lin | 361/710 |
| 2007/0195489 A1 * | 8/2007 | Lai et al. | 361/600 |
| 2007/0223198 A1 * | 9/2007 | Lai et al. | 361/720 |
| 2007/0263360 A1 * | 11/2007 | Lai et al. | 361/719 |
| 2007/0274032 A1 * | 11/2007 | Ni et al. | 361/684 |
| 2008/0013282 A1 * | 1/2008 | Hoss et al. | 361/715 |
| 2008/0101036 A1 * | 5/2008 | Chen | 361/720 |
| 2009/0129026 A1 * | 5/2009 | Baek et al. | 361/710 |
| 2009/0168356 A1 * | 7/2009 | Chen et al. | 361/709 |
| 2009/0268408 A1 * | 10/2009 | Liu et al. | 361/710 |

FOREIGN PATENT DOCUMENTS

| | | |
|---|---|---|
| KR | 336757 B | 5/2002 |
| KR | 2002045747 A | 6/2002 |

* cited by examiner

MEMORY MODULE ASSEMBLY INCLUDING HEAT-SINK PLATES WITH HEAT-EXCHANGE FINS ATTACHED TO INTEGRATED CIRCUITS BY ADHESIVE

CROSS-REFERENCE TO RELATED APPLICATIONS

The present application is a continuation-in-part of co-owned and co-pending U.S. application Ser. No. 11/382,467, filed May 9, 2006, entitled "Memory Module Assembly Including Heat Sink Attached To Integrated Circuits By Adhesive", which is a continuation-in-part of U.S. application Ser. No. 10/956,893, filed Sep. 29, 2004, entitled "Memory Module Assembly Including Heat Sink Attached To Integrated Circuits By Adhesive", now issued as U.S. Pat. No. 7,215,551.

The present application is also related to U.S. application Ser. No. 10/707,623, filed on Dec. 24, 2003, entitled "Heat Sink Riveted to Memory Module with Upper Slots and Open Bottom Edge for Air Flow", now U.S. Pat. No. 7,023,700, and U.S. application Ser. No. 10/337,782, filed on Jan. 8, 2003, entitled "Structure for Removable Cooler", now U.S. Pat. No. 6,775,139.

FIELD OF THE INVENTION

This invention relates to standardized memory modules for expanding the memory capacity of personal computers and other computing systems, and more particularly to memory module assemblies that include heat-sink structures.

BACKGROUND OF THE INVENTION

Heat sinks have been widely used to assist in cooling electronic components. Some microprocessors have heat sinks attached to allow for higher-frequency operation. Other components such as memory modules may also benefit from heat sinks.

Most personal computers (PC's) are shipped with sockets for memory modules so that their owners can later add additional modules, increasing the memory capacity of the PC. Other non-PC devices may also use memory modules designed for PC's. High-volume production and competition have driven module costs down dramatically, benefiting the buyer.

Memory modules are made in many different sizes and capacities, with the older 30-pin modules replaced by 72-pin, 168-pin, and other size modules. The "pins" were originally pins extending from the module's edge, but now most modules are lead-free, having metal contact pads, fingers, or leads. The modules are small in size, some being about 5.25 inches long and 1.2 or 1.7-inches high.

Conventional memory modules include a small printed-circuit board (PCB) substrate and several surface mounted components (e.g., memory devices) mounted on one or both surfaces of the PCB substrate. The PCB substrate is typically a multi-layer board with alternating laminated layers of fiberglass insulation and foil or metal interconnection layers. The contact pads (or other contact structures) are typically aligned along a bottom (connector) edge of the PCB substrate. The interconnect layers define wiring traces that provide signal paths between the surface mounted components and the contact pads. The surface mounted components (e.g., memory devices) are soldered or otherwise attached to one or both surfaces of the substrate, with each component typically including one or more integrated circuit (IC) "chips" that are packaged in inexpensive surface-mount packages such as small-outline J-leaded (SOJ) packages, plastic leaded chip carriers (PLCC's), thin small-outline packages (TSOP) or small-outline (SO) packages. The number of memory devices mounted on the PCB substrate of a memory module depends on the capacity and the data-width of the memory chips and the size of the memory module.

FIG. 17 is a diagram showing a memory module with dynamic-random-access memory (DRAM) devices. The memory module contains substrate 10, with surface-mounted DRAM devices 20 mounted directly to the front surface or side of substrate 10, while more DRAM devices (not visible) are usually mounted to the back side or surface of substrate 10. Metal contact pads 12 are positioned along the bottom or connector edge of the module on both front and back surfaces. When the memory module is mounted into a host system (e.g., a personal computer (PC)), metal contact pads 12 mate with pads on a module socket (not shown) to electrically connect the module to the host system's motherboard. Holes and/or notches 14, 16 are sometimes used to ensure that the module is correctly positioned in the socket. For example, notch 14 can be offset from the center of substrate 10 to ensure that the memory module cannot be inserted backwards in a socket. Notches 16 match with clamps of the module socket to ensure that the memory module is securely positioned in the socket.

As processor speeds have increased, the need for faster memory has become more critical. Various bandwidth-enhancing methods and memory interfaces have been used. Memory chips have higher densities and operate at higher frequencies than before, producing more waste heat from the memory chips. Thus, a need has arisen to remove this waste heat from memory modules.

Conventional memory module assemblies typically include three components: the memory module PCBA and two metal heat-sink plates that are coupled together using one or more fasteners, such as a metal clamp. The contact between PCBA and metal heat-sink plate is usually aided by sandwiching a tape of thermal interface material (TIM) in-between. Various heat-sink plates have been designed for producing such memory module assemblies. See for example U.S. Pat. Nos. 6,362,966, 6,424,532, and 6,449,156, among others. Clamp-on heat-sink plates for memory modules are also known. For example, OCZ Technology produces a copper heat sink with wider metal bands that clip the heat sink to over the front and back surfaces of the memory module. These clip-on and clamp-on designs increase the manufacturing costs and complexity of the associated memory modules because they are difficult to incorporate into automated production lines. Further, the use of clamps or similar structures facilitates easy disassembly by users, resulting in undesirable situations. Moreover, the presence of the clamps and thermal interface material increase the overall thickness of the memory module assembly, thereby taking up valuable motherboard space.

What is needed is a memory module assembly having a protective metal heat-sink plate (shield) mounted over the surface mounted IC devices of a memory module PCBA that both serves to protect the PCBA and to dissipate heat generated by the IC devices, and is easily and inexpensively produced using automated methods.

SUMMARY OF THE INVENTION

The present invention is directed to a memory module assembly including heat sink plates that are directly attached to one or more of the integrated circuits (IC) devices of a memory module printed circuit board assembly (PCBA) using an adhesive, whereby the heat-sink plates both protect the memory module PCBA and dissipate heat generated by the IC devices thereof. By directly attaching the heat-sink plates to the IC devices of the memory module PCBA, the present invention facilitates a simplified automated manufacturing method that greatly reduces overall production costs.

The memory module assembly of the present invention utilizes a memory module PCBA that is essentially identical to conventional memory modules, thus allowing the present invention to be utilized with existing electronics. That is, similar to conventional memory modules, the IC devices are surface mounted on both surfaces of a printed-circuit board (PCB) substrate. The PCB substrate includes metal contact pads arranged along a connector (bottom) edge, and multiple wiring traces that provide signal paths between the IC devices and the contact pads. An important aspect of the present invention is the IC devices are packaged and surface mounted on the PCB substrate such that an upper surface of each of these IC devices defines a plane that is substantially parallel to the planar PCB surface on which it is mounted, although the height of each IC device may vary. In particular, the planar upper surfaces of these IC devices are used to secure the memory module PCBA to planar underside surfaces of the heat sink plates by way of the adhesive.

According to an embodiment of the present invention, the adhesive is a heat-activated or heat-cured adhesive that is applied to either the upper surface of the one or more IC devices, or to the planar underside surfaces of the heat-sink plates. When applied, the adhesive is viscous and has a relatively low adhesion to facilitate manipulation of the cover and memory module PCBA until a desired orientation is achieved. The adhesive is then compressed between the heat-sink plate and IC devices, and is held in the compressed state using a fixture. The fixture is then passed through an oven maintained at a specified temperature (i.e., at or lower than the maximum safe operating temperature for the memory module components) to activate or cure the adhesive. In one embodiment, a heat-activated adhesive is used that exhibits a relatively low adherence prior to being heated to a high temperature (i.e., equal to or less than the maximum safe operating temperature of the memory module assembly), and the heat-activated adhesive exhibits a high adherence when subsequently cooled. In this case, subsequent removal of the heat-sink plates from the memory module PCBA requires reheating at a predetermined temperature to reflow the adhesive. In another embodiment, the heating process is used to "cure" a relatively highly thermally conductive adhesive, subsequent separation of the heat-sink plate requires the use of a chemical solvent to dissolve the heat-cured adhesive. In both cases, unauthorized tampering (i.e., removal of the heat-sink plates to access the IC devices) is rendered more difficult and easier to detect than conventional memory modules that utilize clips or fasteners. Further, the heat-cured adhesive is thin and thermally conductive to reduce thermal resistance between the IC devices and the heat-sink plates, thus facilitating a relatively high rate of heat flow from the IC devices to maintain relatively low operating temperatures. Thus, the use of heat-activated and/or heat-cured adhesive facilitates a greatly thinner memory module with heat sink and simplified assembly process whereby the heat-sink plates are secured to protect the memory module PCBA in a manner that reduces overall manufacturing costs, and prevents unauthorized tampering. In other embodiments, the adhesive maybe a high thermal conductive adhesive film, a thermal-bond adhesive film, a thermal paste, or a combination or laminated structure thereof.

According to an embodiment of the present invention, a memory module assembly is provided for DDR-type PCBAs (e.g., PCBAs meeting DDR2 or DDR3 standards) in which a first heat-sink plate includes an elongated central base structure, a contact plate integrally connected to and extending away from one side of the base structure, and one or more rows of finger-like heat-exchange fins extending from a second side of the base structure. The contact plate has a first outer surface and an opposing first underside surface, and forms a step-like positioning surface with the base structure. Similar to the above-described embodiment, when the PCBA is mounted onto the first heat-sink plate, an adhesive portion is sandwiched between an underside surface of the first heat-sink plate and upper surfaces of the IC devices disposed on the PCBA. However, during the assembly process, the PCBA is easily and quickly positioned on the first heat-sink plate by contacting the second edge (i.e., the edge opposite to the contact edge) against the positioning surface provided on the first heat-sink plate, thereby simplifying the assembly process and reducing production costs. Another advantage provided by the first heat-sink plate is the improved cooling provided by the finger-like heat-exchange fins, which extend parallel the plane defined by the PCBA and facilitate efficient heat conduction and from the PCBA by way of the contact plate and base portion, and radiant and convective heat transfer to the surrounding air, thus facilitating heat removal and eliminating the need for additional thermal interface materials. Optional ridges are formed on the outer (i.e., outward facing) surface of the first heat-sink plate to further enhance heat transfer.

The first heat-sink plate described above is suitable for DDR memory modules having IC devices disposed only on one side of the PCBA. When IC devices are disposed on both sides of the PCBA, a second heat-sink plate is mounted onto the upper surfaces of the second row of IC devices by way of a second layer of adhesive, and is engaged with the first heat-sink plate in order to provide a secure and rigid structure. In one embodiment, the second heat-sink plate includes an engaging protrusion that is received inside an elongated engaging groove that is defined in the base portion of the first heat-sink plate, thereby providing a rigid and secure connection between the two plates. In an alternative embodiment, a side edge of the second heat-sink plate is mounted onto an engaging shelf defined at the upper end of the positioning surface on the first heat-sink plate.

In accordance with alternative embodiments of the present invention, the first and second heat-sink plates either have different shapes and sizes to facilitate efficient and secure connection to the PCBA, or have the same size and shape to facilitate low-cost manufacture. In one series of embodiments, the first heat-sink plate is substantially larger than the second heat sink plate, and includes two rows of heat-exchange fins that are separated by an air gap. In other embodiments, the first heat-sink plate is substantially identical to the second heat sink plate, and each plate includes a row of heat-exchange fins arranged such that, when assembled to the PCBA, the two rows of heat-exchange fins are separated by an air gap. In one specific embodiment, each of the first and second heat-sink plates includes an elongated mounting surface disposed along a top of the associated positioning surface, and the two elongated mounting surfaces are pressed against each other when the PCBA is mounted between the first and second heat-sink plates. In another specific embodiment, each of the first and second heat-sink plates includes mounting structures disposed at opposite ends of the positioning surface, and the opposing mounting structures are pressed against each other when the PCBA is mounted between the first and second heat-sink plates. In yet another specific embodiment, the first and second heat-sink plates remain entirely separated from each other by an air gap.

DETAILED DESCRIPTION

The present invention relates to improvements in memory module assemblies (i.e., a memory module printed circuit board assembly (PCBA) and one or more heat-sink plates). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figures 1A, 1B:
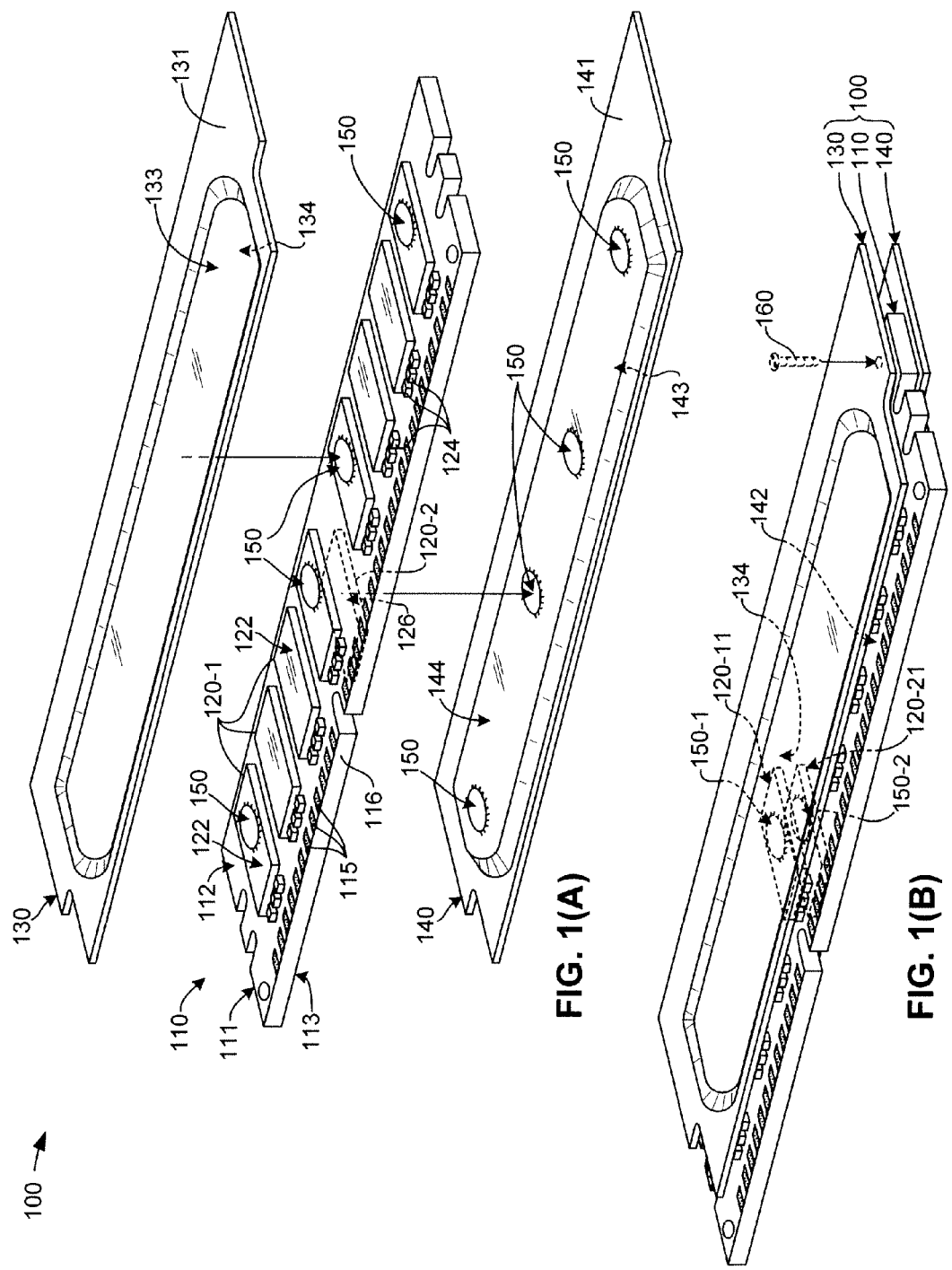
FIGS. 1(A) and 1(B) are an exploded perspective view and an assembled perspective view, respectively, showing a memory module assembly according to an embodiment of the present invention.
Figure 2:
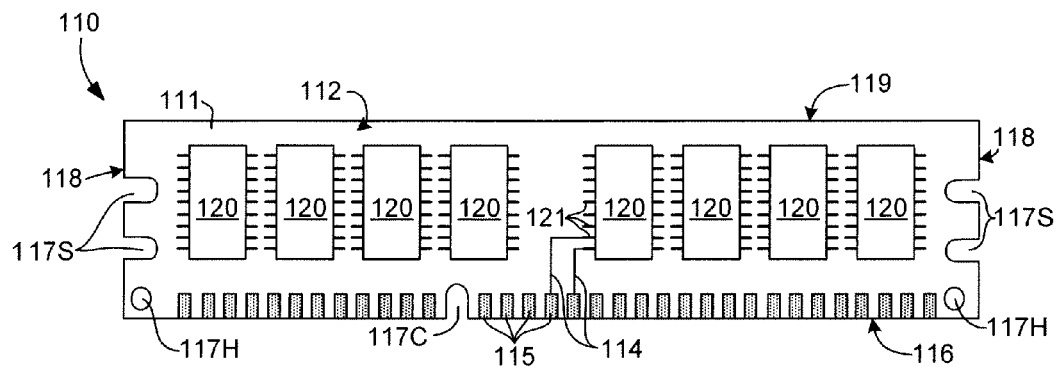
FIG. 2 is a top view showing a memory module PCBA of the memory module assembly shown in FIG. 1(A).
Figure 3:
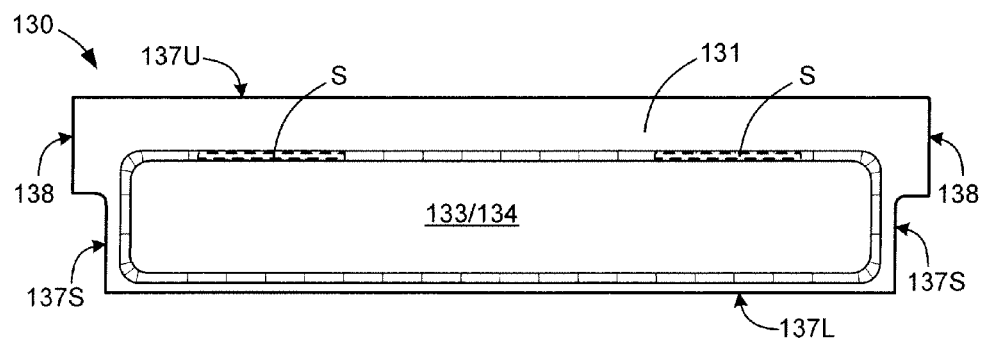
FIG. 3 is a top view showing a heat-sink plate of the memory module assembly shown in FIG. 1(A).
Figure 4A:
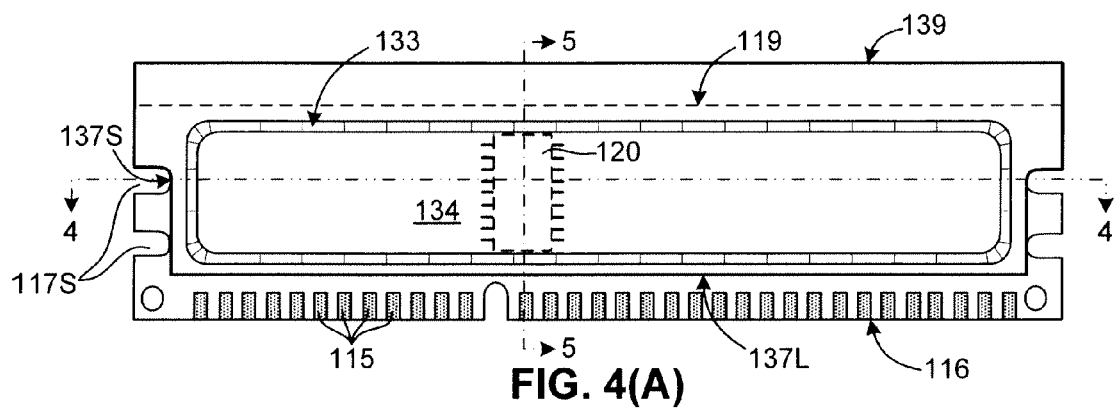
FIGS. 4(A) and 4(B) are top and cross-sectional side views showing the memory module assembly shown in FIG. 1(A).
Figure 4B:
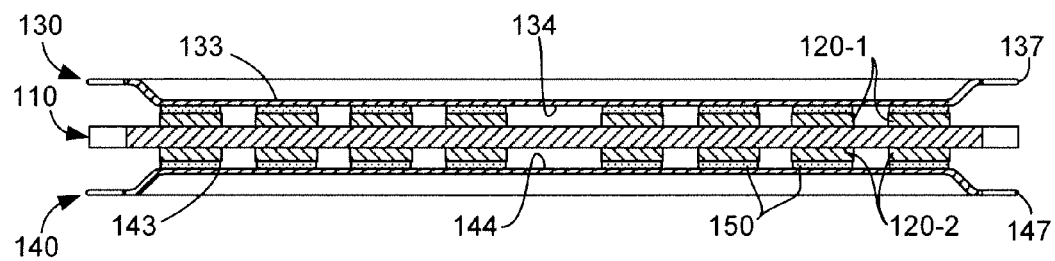
Figure 5:
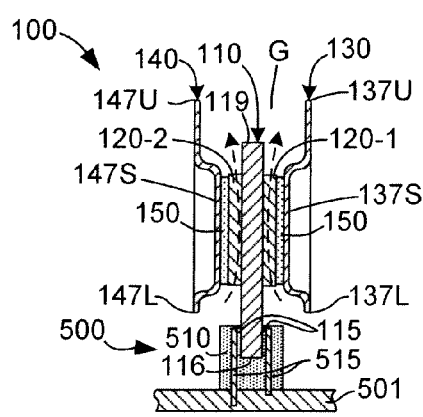
FIG. 5 is a cross-sectional end view showing the memory module assembly shown in FIG. 1(A).

FIGS. 1(A) to 5 show a memory module assembly 100 according to a simplified embodiment of the present invention. Memory module assembly 100 generally includes a memory module PCBA 110 and one or more heat-sink plates 130 and 140. FIGS. 1(A) and 1(B) are exploded perspective and assembled perspective views, respectively, showing the basic components of memory module assembly 100. FIG. 2 is a top view showing memory module PCBA 110 by itself, and FIG. 3 is a top plan view showing heat-sink plate 130 by itself. FIGS. 4(A) and 4(B) are top and cross-sectional side views, respectively, showing heat-sink plates 130 and 140 mounted on memory module PCBA 110. Finally, FIG. 5 is a cross-sectional end view taken along section line 5-5 of FIG. 4(A). Although the embodiment described below utilizes two heat-sink plates (i.e., plates 130 and 140) mounted onto opposite sides of memory module PCBA 110, unless otherwise specifically recited in the appended claims, only one heat-sink plate (i.e., plate 130 or plate 140) may be attached to only one side of memory module PCBA 110 in the manner described below.

Referring to FIGS. 1(A) and 2, memory module PCBA 110 includes a printed circuit board (PCB) substrate 111 having an upper (first) surface 112 and an opposing lower (second) surface 113, and several integrated circuit (IC) memory devices (e.g., dynamic-random-access memory (DRAM) devices) 120-1 and/or 120-2 that are mounted on at least one of the upper and lower surfaces. PCB substrate 111 includes a network of wiring traces 114 (shown in FIG. 2) that are formed on at least one of upper surface 112 and lower surface 113, and extend through layers of insulating material (e.g., FR4) according to known manufacturing techniques. Selected wiring traces 114 are connected between contact leads 121 of selected memory devices 120 and associated contact pads 115 that are arranged in a row along a lower (connector) edge 116 on both surfaces 112 and 113 of PCB substrate 111. Metal contact pads 115 facilitate pluggable connection of memory module assembly 100 into a host system (e.g., a PC or other computer system) to increase available memory capacity by way of memory devices 120. Referring to FIG. 5, when memory module assembly 100 is mounted into a host system 500, metal contact pads 115 mate with pads 515 on a module socket 510 to electrically connect the module to the host system's motherboard 501. Optional side edge notches 117S, holes 117H, and connector edge notch 117C are provided along side edges 118 and connector edge 116 to ensure that the module is correctly positioned in the socket. Upper edge 119 is located opposite to connector edge 116.

Although generally referred to herein as memory devices, IC devices 120-1 and 120-2 (collectively referred to as IC devices 120) may include one or more additional control IC devices, such as a processor, an application specific integrated circuit (ASIC), and/or a programmable logic device (PLD). Further in addition to IC devices 120, additional electrical and electronic components 124 (shown in FIG. 1(A)), such as capacitors and inductors, may be included on PCB substrate 111 using known techniques.

According to an embodiment of the invention, each memory device is packaged such that its upper surface is planar (e.g., Thin Small Outline Package (TSOP)), and is maintained such that each planar upper surface is parallel to PCB substrate 111. For example, as shown in FIG. 1(A), each memory device 120-1 is mounted on upper surface 112 such that its planar upper surface 122 is maintained parallel to upper surface 112. Similarly, each memory device 120-2 is mounted on lower surface 113 such that its planar upper surface 126 is maintained parallel to lower surface 113.

Referring to FIGS. 1(A) and 3, heat-sink plates 130 and 140 are metal structures formed, for example, from a suitable sheet metal (e.g., copper, aluminum, stainless steel or a metal alloy). As indicated in FIG. 1(A), in one embodiment, heat-sink plate 130 includes a flat peripheral region 131 surrounding a depressed (indented) planar outer surface 133, and a planar underside surface 134 formed on the outside (convex, lower facing) surface opposed to planar outer surface 133. Similarly, heat-sink plate 140 includes a flat peripheral region 141 surrounding a depressed (indented) planar outer surface 143, and a planar underside surface 144 formed on the inside (upward facing) surface opposed to outside surface 143. Underside surfaces 134 and 144 are secured in the manner described below to one or more associated memory devices 120. Note that, as indicated in FIGS. 4(B), depression regions defined by planar surfaces 133/143 are formed such that the footprint of these regions encloses all of IC devices 120 (i.e., such that planar underside surfaces 134/144 contact all of upper surfaces 122/126 of IC devices 120-1/120-2). As shown in FIG. 3, one or both heat-sink plates (e.g., plate 130) may include one or more slots S for heat dissipation. Each heat-sink plate 130/140 has a lower edge 137L/147L, side edges 137S/147S, and an upper edge 137U/147U. In addition, as shown in FIG. 3, the side edges of each plate are modified to expose the notches formed in PCB substrate 111 (e.g., plate 130 includes a groove 137S for exposing side notches 117S, as indicated in FIG. 4(A)).

As indicated in FIGS. 1(B), 4(A), 4(B) and 5, when heat-sink plates 130/140 are mounted onto memory module PCBA 110, heat-sink plates 130/140 substantially overlap PCB surfaces 112/113 in such a way that IC devices 120 are protected, but contact pads 115 are exposed for pluggable insertion of contact pads 115 into host socket 510 (shown in FIG. 5). For example, as indicated in FIGS. 4(A) and 5, lower edges 137L/147L of heat-sink plates 130/140 are aligned above connector edge 116 of PCB substrate 111 such that contact pads 115 extends below lower edges 137L/147L of heat-sink plates 130/140, and upper edges 137U/147U of heat-sink plates 130/140 protrude above upper edge 119 of PCB substrate 111. Referring to FIG. 5, in accordance with the disclosed embodiment, an opening (gap) G is provided between heat-sink plates 130/140 and PCB substrate 111 adjacent to upper edges 137U/147U to allow air heated by IC devices 120-1 and 120-2 to escape. Note that side edges 137S/147S and upper edges 137U/147U of heat-sink plates 130/140 may be bent inward/downward to narrow the space therebetween (e.g., gap G) to provide a better protection for the electronic components from potential dust contamination, but this may reduce air flow. The upward air flow (e.g., as indicated by dashed arrows in FIG. 5) induced by free convection will enhance heat dissipation from IC devices 120-1/120-2, and thus reduce the operating temperature of memory module assembly 100. Of course, in addition to the heat dissipated by free convection in the generally upward directions, heat is also dissipated to the surrounding air from the external surfaces of heat-sink plates 130/140 by free convection and radiation.

Referring to FIGS. 1(A), 1(B), 4(A), 4(B) and 5, according to the present invention, adhesive portions 150 are applied to planar upper surfaces 122/126 of selected memory devices 120-1/120-2 and/or to planar underside surfaces 134/144 of heat-sink plates 130/140, and are then sandwiched therebetween in a manner that secures heat-sink plates 130/140 to memory module PCBA 110. For example, as indicated in FIG. 1(B), a discrete adhesive portion 150-1 (shown in dashed lines) is sandwiched between planar underside surface 134 of heat-sink plate 130 and upper surface 122 of an associated IC device 120-11 (also shown in dashed lines) such that heat-sink plate 130 is secured to memory module PCBA 110 by adhesive portion 150-1. Similarly, a second discrete adhesive portion 150-2 is sandwiched between planar underside surface 144 of heat-sink plate 140 and upper surface 126 of an associated IC device 125-21 (also shown in dashed lines) such that heat-sink plate 140 is secured to memory module PCBA 110 by adhesive portion 150-2. By securing heat-sink plates 130/140 to memory module 110 using adhesive portions 150 instead of fasteners, the manufacturing process for producing memory module assemblies 100 is greatly simplified, and in addition tampering (i.e., removal of heat-sink plates 130/140 to access IC devices 120/125) is more reliably prevented and more easily detected.

According to an embodiment of the present invention, adhesive portions 150 comprise heat-activated adhesive that is applied to either upper surfaces 122/126 of one or more IC devices 120-1/120-2, or to the planar underside surfaces 134/144 of heat-sink plates 130/140. In this embodiment, the heat-activated adhesive 150 is softened (i.e., exhibits a relatively low adherence) when heated to a high temperature (i.e., equal to or less than the maximum operating temperature of the memory module assembly), and the heat-activated adhesive exhibits a high adherence when subsequently cooled. The advantage of such heat-activated adhesives is that they can be removed by heating, and thus enable reworking. In this case, subsequent removal of the heat-sink plates from the memory module PCBA requires reheating at a predetermined temperature to reflow the adhesive. Heat-activated adhesives of this type are typically produced in the form of thin film or tape can be used for IC devices that generate less heat, and the main purpose of heat-sink plates 130/140 is thus relegated to mainly protecting the IC devices. Such heat-activated adhesive material forms a thin and continuous layer between the heat-sink plate and the upper external surface of the IC devices. As the newly formed interface layer is thin and can be made substantially void-free (i.e., very few air bubbles), the thermal resistance through the adhesive layer is relatively small. The ability to rework, for example through heating, becomes an important consideration. Thermoplastic based adhesive material such as thermal bonding film (e.g., product numbers TBF615, TBF668) produced by 3M of St. Paul Minn., and thermally conductive materials, such as that sold under product number TC100U by ThermaCool of Worcester, Mass. may also be used.

While heat-activated adhesives provide an advantage in that they can be reworked by reheating, such adhesives typically exhibit relatively low thermal conductivity, thus making them less desirable in applications that require a high level of heat dissipation through the heat-sink plates.

In another embodiment, adhesive portions 150 comprise an adhesive material that is "cured" during a heating process (i.e., exhibits an initial, relatively low adherence when applied, and a relatively high adherence after being heat-cured). Such heat-cured adhesives typically exhibit relatively high thermal conductivity relative to heat-activated adhesives, and are therefore more desirable in applications that require a high level of heat dissipation through the heat-sink plates. The heat-cured adhesive material is applied in the form of paste, and is re-distributed under heat and pressure during curing to bond the IC devices and heat-sink plates together. The curing process takes place at elevated temperature, and can be expedited with the use of activator. The re-distribution process causes the adhesive material to flow and fill the void between the heat sink plate and memory surface, resulting in a thin, good contact therebetween that reduces thermal resistance from the heat source (IC device) to the heat-sink plate. A dispensing machine can be used to ensure even distribution of the adhesive material. In one embodiment, the heat-cured adhesive consists of silicone elastomer-based resin for re-workability and survivability at elevated temperature that the electronic components may encounter. Metallic fillers may be added to improve thermal conductivity. On suitable heat-cured adhesive is provided by Dow Corning (e.g., product number 3-6752). Such adhesives are removed using solvent to enable rework.

Although heat-activated and heat-cured adhesive materials provide superior connection between the heat-sink plates and memory module PCBA, it is also possible to use other types of adhesives (e.g., high viscosity adhesives or thermal compounds) in the manner described herein to provide suitable connections. Therefore, unless otherwise specified in the appended claims, the term "adhesive portion" is intended to include any non-corrosive adhesive that can reliably connect the heat-sink plates and memory module PCBAs described herein.

In addition, although the present invention is described above with certain benefits associated with attaching heat-sink plates 130 and 140 to memory module PCBA 110 solely by adhesive portions 150, in some embodiments an optional fastener (e.g., a screw, rivet or clamp) or clip may be utilized to provide a sturdier and more reliable engagement arrangement.

The embodiment described above with reference to FIGS. 1(A) to 5 includes heat-sink plate edge features that maximize cooling efficiency by allowing essentially unimpeded airflow under the heat sink plates (i.e., between the heat sink plates and the PCB substrate). Even though the area between the heat sink and substrate is small and mostly occupied by the IC (e.g., memory and controller) devices, small gaps between adjacent pairs of IC devices can channel air flow past the IC devices, directly cooling the IC devices as well as cooling the heat sink plate from both the underside surface and its larger, exposed top surface. The inventors encourage this airflow through the tiny channels between IC devices by maintaining openings (e.g., gap G shown in FIG. 5) near the top edge of the memory module assembly. These openings allow air to escape from between the PCB substrate and the heat sink plates. Air enters the gaps between the heat sink and the PCB substrate from the open bottom edge near the lower connector edge, and flows between the memory devices and out the top-edge openings. Stagnant air under the heat sink plates is thus reduced.

Figure 6A:
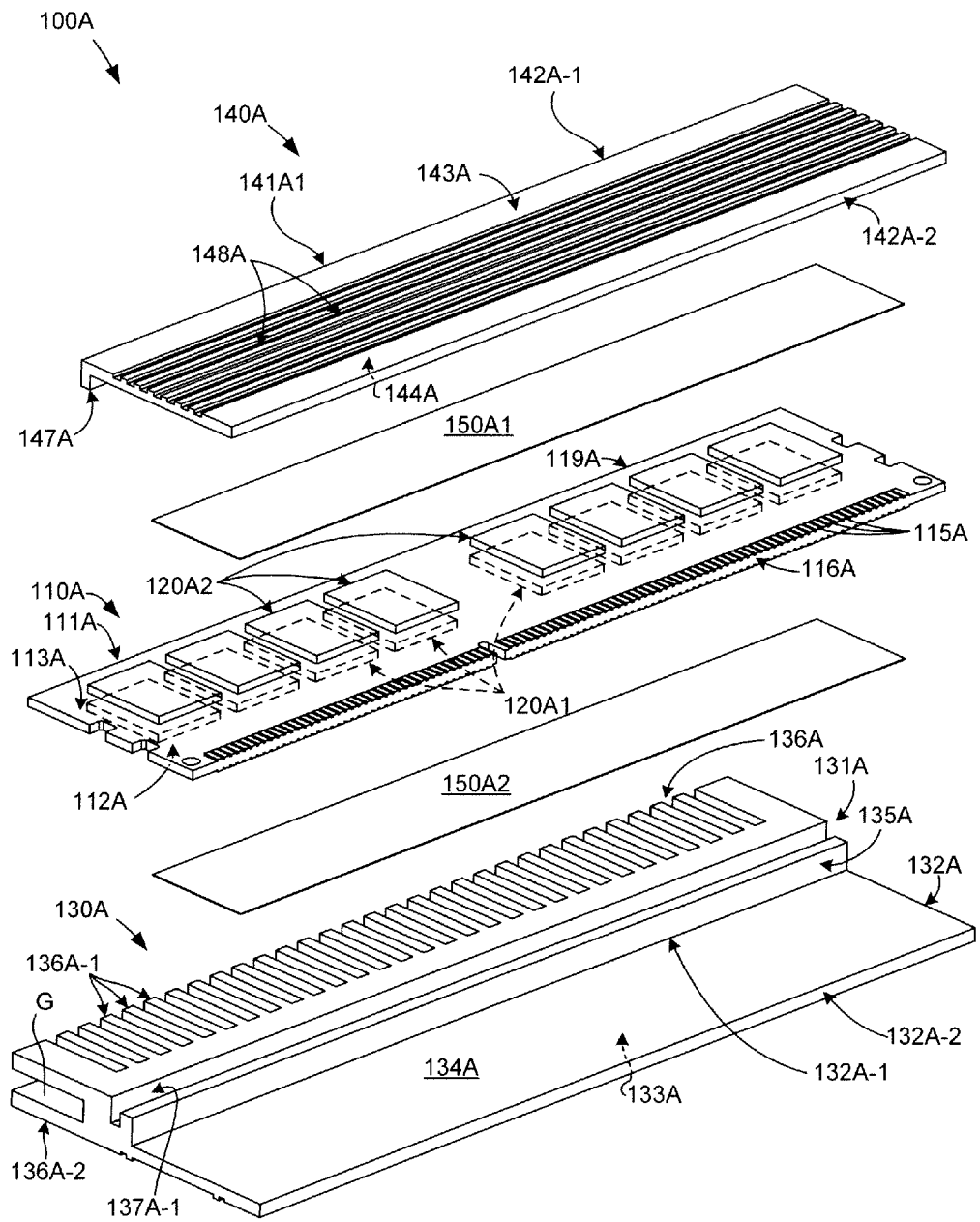
FIGS. 6(A), 6(B), 6(C) and 6(D) are exploded perspective, front assembled perspective, rear assembled perspective, and cross-sectional side views showing a DDR2/DDR3 type memory module assembly according to another embodiment of the present invention.
Figure 6B:
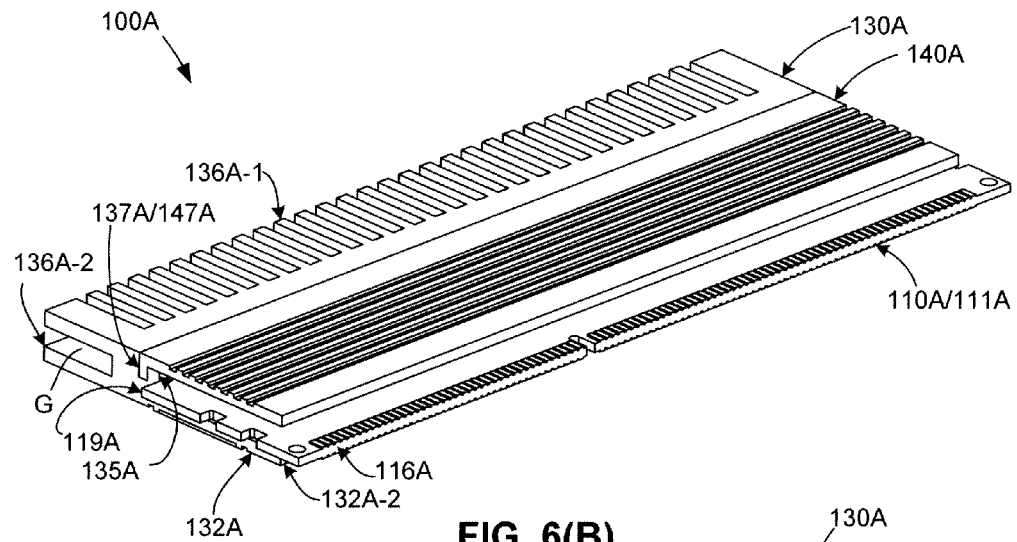

FIGS. 6(A) and 6(B) are exploded perspective and cross-sectional side views showing a DDR-DIMM-type memory module assembly 100A according to another embodiment of the present invention. Memory module assembly 100A includes a Double-Data-Rate (DDR) DIMM printed circuit board assembly (PCBA) 110A, a lower (first) heat-sink plate 130A attached to PCBA 110A by adhesive portion 150A1 and an upper (second) heat-sink plate 140A attached to PCBA 110A by an adhesive portion 150A2.

In the present embodiment, DDR-DIMM PCBA 110A is a memory device that conforms to standards set for DDR devices by the Joint Electron Device Engineering Council (JEDEC), and preferably conforms to the JEDEC standards established for the DDR2 or DDR3 classes of devices (collectively referred to herein as "DDR2/DDR3 devices"), which are well known in the art. Similar to PCBA 110 (described above), DDR-DIMM PCBA 110A includes a substrate 111A having opposing lower (first) and upper (second) surfaces 112A and 113A, and (first) wiring traces (not shown) connected to associated metal contact pads 115A that are disposed along a connector edge 116A of substrate 111A. Note that substrate 111A has a second long edge 119 that is disposed opposite to connector edge 116. In addition, several (first IC) memory devices 120A1 and several (second IC) memory devices 120A2 (e.g., SDRAM devices) are respectively mounted on lower surface 112A and upper surface 113A. As in the previous embodiments, upper surfaces 122A1 of devices 120A1 face away from substrate 111A, and define a first plane P1, and lower surfaces 122A2 of devices 120A2 substantially define a second plane P2 (both shown in FIG. 6(D)) that are parallel to first surface 112A and second surface 113A, respectively, of substrate 111A.

Referring to the lower portion of FIG. 6(A), lower heat-sink plate 130A differs from the earlier embodiment in that it includes an elongated (first) base structure 131A, a (first) contact plate 132A having a fixed edge 132A-1 connected to the base structure and a free edge 132A-2 disposed away from base structure 131A, and several finger-like heat-exchange fins 136A extending from base structure 131A in a direction opposite to contact plate 132A. Contact plate 132A has a (first) outer surface 133A and an opposing planar (first) underside surface 134A, and is integrally connected (i.e., formed in a single molding process or machined from a single material block, or fixedly attached e.g. by welding) to base structure 131A such that a step-like positioning surface 135A is defined by underside surface 134A and a portion of base structure 131A.

Figure 6C:
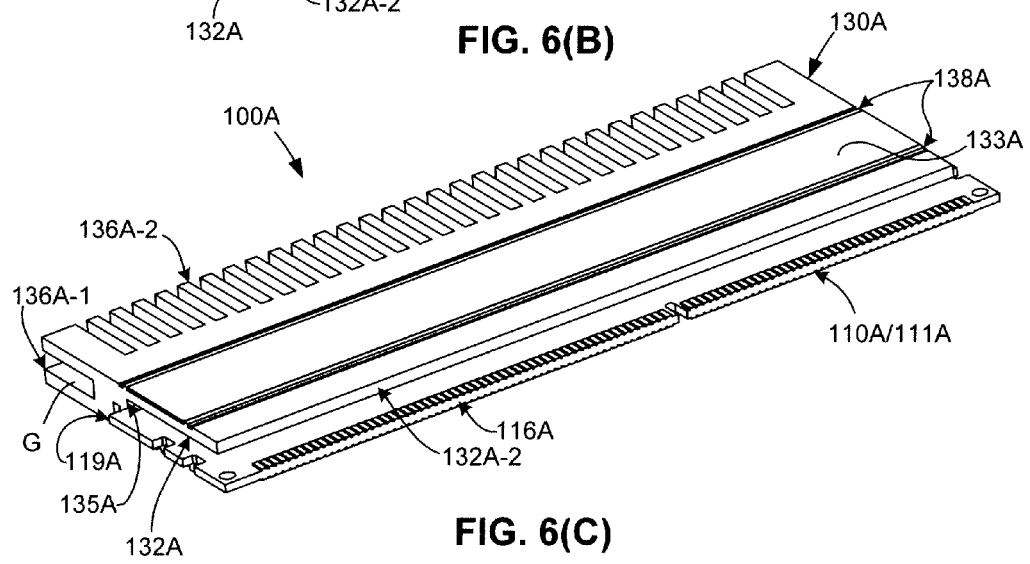
Figure 6D:
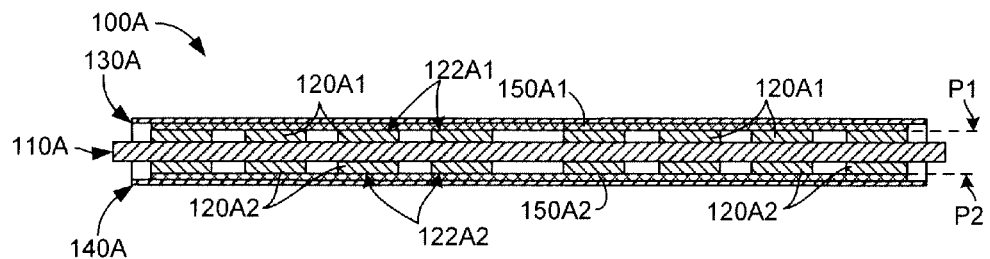

Lower heat-sink plate 130A provides several advantages over previously described embodiments, including features that facilitate and easier (and hence less expensive) assembly process. Similar to the above-described embodiment, when PCBA 110A is mounted onto lower heat-sink plate 130A, an adhesive portion 150A1 is sandwiched between underside surface 134A of contact plate 132A and upper surfaces 122A1 of IC devices 120A disposed on PCBA 110A (see, e.g., FIG. 6(D)). However, during the assembly process, PCBA 110A is easily and quickly positioned on lower heat-sink plate 130A by contacting second edge 119A (i.e., the edge opposite to contact edge 116A) against positioning surface 135A, which is provided on lower heat-sink plate 130A for this purpose, thereby simplifying the assembly process and reducing production costs. That is, as shown in FIGS. 6(B) and 6(C), when fully assembled, memory module PCBA 110A is positioned such that edge 119A of substrate 111A contacts the positioning surface 135A, and connector edge 116A extends beyond free edge 132A-2 of contact plate 132A.

Another advantage provided by first heat-sink plate 130A is the enhanced heat exchange (i.e., cooling) of PCBA 100A that is provided by the finger-like heat-exchange fins 136A, which extend parallel the plane defined by PCBA 110A and facilitate efficient heat conduction by way of contact plate 132A and base portion 131A, and radiant and convective heat transfer to the surrounding air, thus facilitating heat removal and eliminating the need for additional thermal interface materials. In accordance with the present embodiment, finger-like heat-exchange fins 136A are arranged two parallel rows including a first row 136A-1 and a second row 135A-2 that are separated by an elongated air gap G. In addition, optional ridges 138A (shown in FIG. 6(C)) are formed on the outer (i.e., outward facing) surface 133A of lower heat-sink plate to further enhance the heat transfer process.

For DDR memory modules that having IC devices 120A1 disposed only on lower surface 112A of PCBA 110A, lower heat-sink plate 130A (described above) may be utilized alone to provide suitable cooling. However, when IC devices are disposed on both sides of PCBA 110A, as shown in FIG. 6(A), upper heat-sink plate 140A is preferably utilized to facilitate heat transfer from IC devices 120A2 that are disposed on upper surface 113A. Upper heat sink-plate 140A includes a (second) outer surface 143A and an opposing planar (second) underside surface 144A. Upper heat-sink plate 140A is generally mounted such that adhesive layer 150A2 is sandwiched between underside surface 144A and upper surfaces 122A2 of IC devices 120A2, with outer surface 143A facing away from PCBA 110A. Upper heat sink-plate 140A is preferably engaged with lower heat-sink plate 130A in order to provide a secure and rigid structure. In the present embodiment, as shown in FIG. 6(A), upper heat-sink plate 140A includes an elongated engaging protrusion 147A that protrudes from a first edge 142A-1 in the direction of underside surface 144A, and an elongated engaging groove 137A is defined in base portion 131A of first heat-sink plate 130A. As indicated in FIG. 6(B), during the assembly process, after PCBA 110A is mounted onto lower heat-sink plate 130A in the manner described above, upper heat-sink plate 140A is mounted onto the sub-assembly such that engaging protrusion 147A is received inside engaging groove 137A, whereby precise positioning of upper heat-sink plate 140A relative to lower heat-sink plate 130 is greatly simplified, thereby reducing manufacturing costs. Upper heat-sink plate 140A also includes optional ridges 148A that further enhance the heat exchange process.

Similar to the embodiments described above, planar underside surfaces 134A and 144A of heat-sink plates 130A and 140A are respectively secured to the upper surfaces 122A1 and 122A2 of DRAM devices 120A1 and 120A2 by way of thermal-bond adhesive film portions 150A1 and 150A2. In particular, adhesive film portion 150A1 is sandwiched between planar underside surface 134A and the upper surface 122A1 of DRAM devices 120A1. Similarly, adhesive film portion 150A2 is sandwiched between planar underside surface 143A and upper surfaces 122A2 of DRAM devices 120A2. Thus, heat-sink plates 130A and 140A are rigidly secured to PCBA 110A by adhesive film portions 150A1 and 150A2 in a manner similar to that described above. When the IC memory chips are BGA (Ball Grid Array) or CSP (Chip Scale Package), using epoxy underfill to fortify the adhesion between IC chips and PCB package increases the memory module's strength and reliability by providing an additional protection against shock, vibration and bending stiffness of the memory module.

Figure 7A:
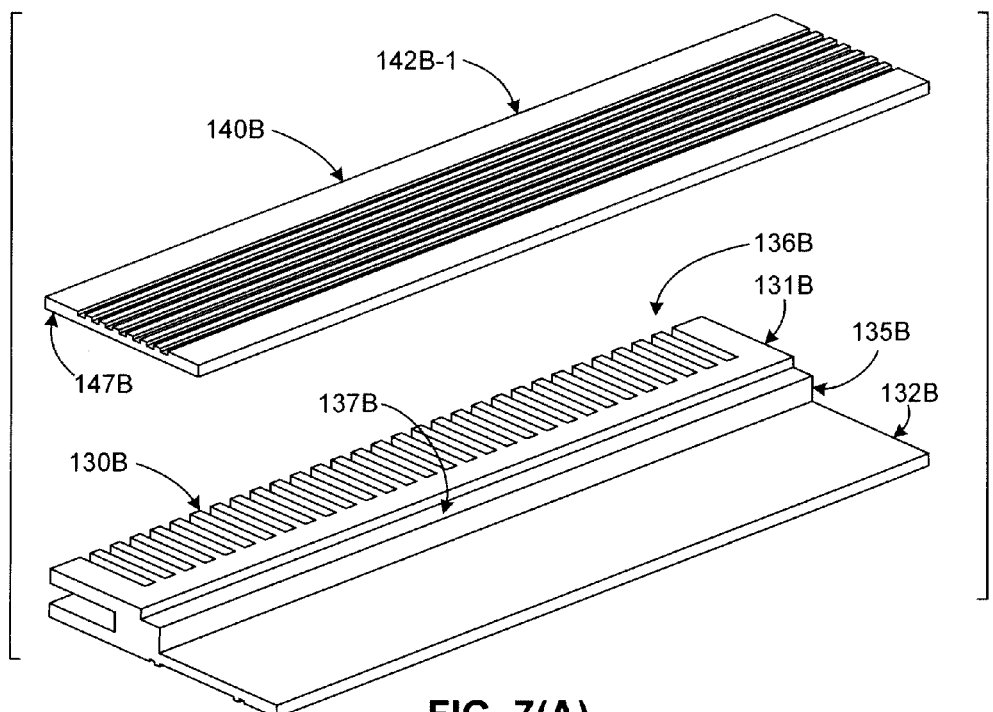
FIGS. 7(A) and 7(B) are exploded perspective and front assembled perspective views, respectively, showing a DDR2/DDR3 type memory module assembly according to another embodiment of the present invention.
Figure 7B:
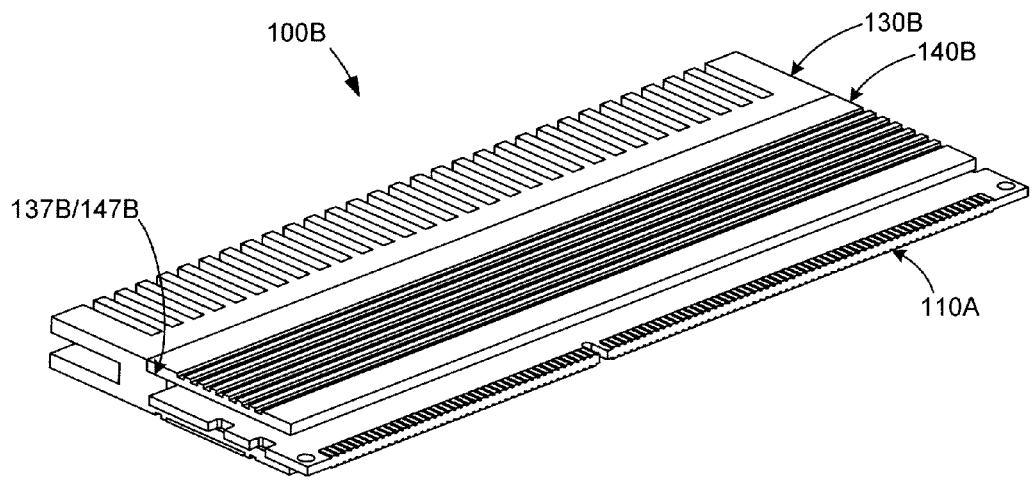

FIGS. 7(A) and 7(B) are exploded perspective and assembled perspective views, respectively, showing a DDR-DIMM-type memory module assembly 100B according to another embodiment of the present invention. As indicated in FIG. 7(A), memory module assembly 100B includes a lower heat-sink plate 130B and an upper heat-sink plate 140B. Omitted from FIG. 7(A) for clarity are DDR PCBA 110A (discussed above) and adhesive portions that are mounted between opposing sides of PCBA 110A and lower heat-sink plate 130B and upper heat-sink plate 140B, respectively, in the manner described above.

Similar to the structure described above, lower heat-sink plate 130B includes an elongated (first) base structure 131B, a (first) contact plate 132B connected to and extending away from base structure 131B, and several finger-like heat-exchange fins 136B formed in two parallel rows extending from base structure 131B in a direction opposite to contact plate 132B. In addition, upper heat sink-plate 140B includes opposing surfaces and mounts onto associated IC devices (not shown) of PCBA 110A using an adhesive layer (not shown).

Heat-sink plates 130B and 140B differ from plates 130A and 140A (described above with reference to FIG. 6(A)) in that elongated base structure 131B of lower heat-sink plate 130B defines an elongated engaging shelf 137B disposed along an upper edge of the positioning surface 135B, and a first edge 142B-1 the second heat-sink plate 140B includes a downward facing engaging surface 147B. Referring to FIG. 7(B), when heat-sink plates 130B and 140B are assembled with PCBA 110A in a manner similar to that described above with reference to FIG. 6(B), engaging surface 147B is mounted onto and abuts elongated engaging shelf 137B, thereby assisting alignment between heat-sink plates 130B and 140B in a manner similar to that described above.

In the embodiments described above with FIGS. 6 and 7, the lower heat-sink plate (i.e., 130A and 130B) is substantially larger than the upper heat sink plate (i.e., 140A and 140B), with the lower heat-sink plate includes two rows of heat-exchange fins that are separated by an air gap G. While these arrangement may facilitate easier assembly and a sturdier structure, these embodiments require production using, e.g., two separate molds or production processes to produce the two different heat-sink plates. In the embodiments described below, both the upper and lower heat-sink plates comprise substantially identical structures (i.e., both are formed from a single mold and/or produced to the same manufacturing specifications, whereby any differences between the upper and lower heat-sink plates are due solely to manufacturing process variations).

Figure 8A:
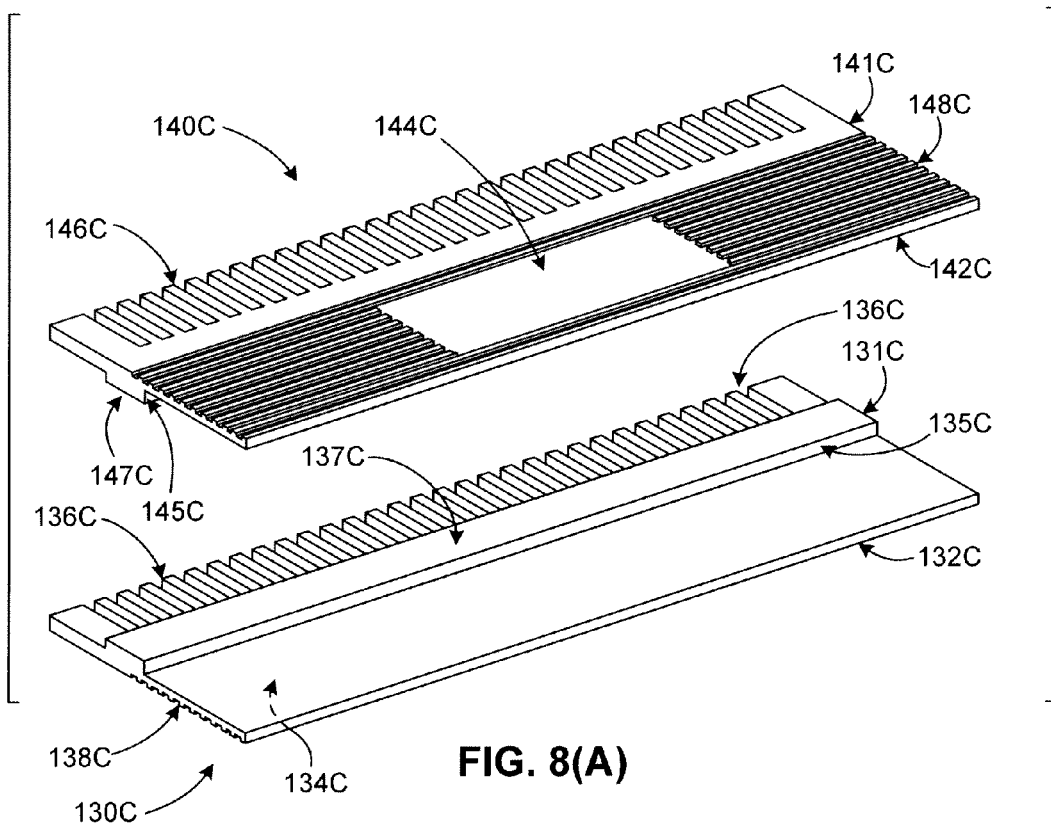
FIGS. 8(A) and 8(B) are exploded perspective and front assembled perspective views, respectively, showing a DDR2/DDR3 type memory module assembly according to another embodiment of the present invention.
Figure 8B:
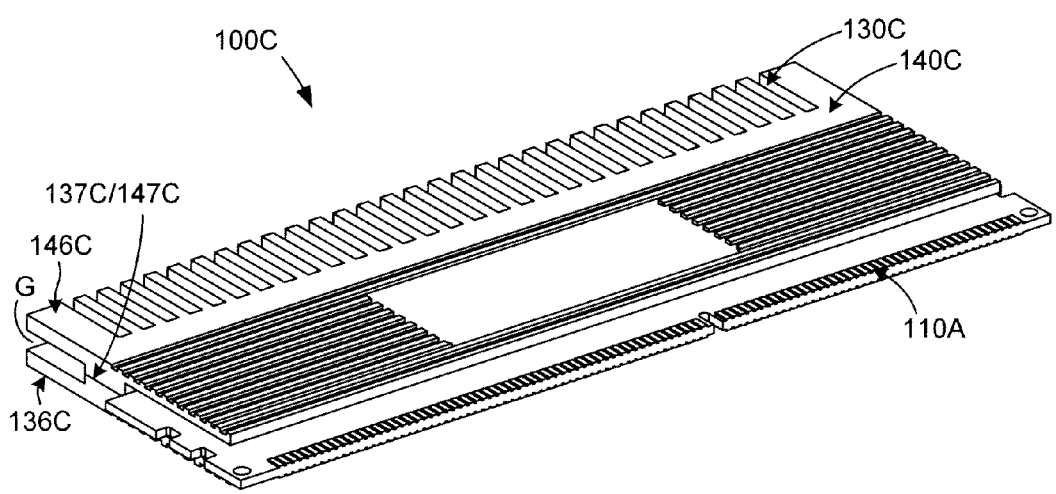

FIGS. 8(A) and 8(B) are exploded perspective and assembled perspective views showing a DDR-DIMM-type memory module assembly 100C according to another embodiment of the present invention. As indicated in FIG. 8(A), memory module assembly 100C includes a lower heat-sink plate 130B and an upper heat-sink plate 140C, which comprise substantially identical structures. Omitted from FIG. 8(A) for clarity are DDR PCBA 110A (discussed above) and adhesive portions that are mounted between opposing sides of PCBA 110A and lower heat-sink plate 130C and upper heat-sink plate 140C, respectively, in the manner described above.

Similar to lower heat-sink portion 130A (described above), both lower heat-sink plate 130C and upper heat sink plate 140C respectively include a base structure, a contact plate, and a row of heat-exchange fins. Referring to the lower portion of FIG. 8(A), lower heat-sink plate 130C includes an elongated (first) base structure 131C, a (first) contact plate 132C connected to and extending away from base structure 131C such that a step-like positioning surface 135C is formed, and several finger-like heat-exchange fins 136C formed in a single row and extending from base structure 131C in a direction opposite to contact plate 132C. Similarly, upper heat-sink plate 140C includes an elongated (second) base structure 141C, a (second) contact plate 142C connected to and extending away from base structure 141C, and several heat-exchange fins 146C formed in a single row and extending from base structure 141C in a direction opposite to contact plate 142C. Each outward facing surface 134C and 144C of contact plates 132C and 142C include ridges 138C and 148C, respectively, that surround a central flat surface region used for label placement.

In accordance with the present embodiment, each heat-sink plate 130C and 140C includes an elongated mounting surface that is formed along an upper surface of the respective positioning surface, and these mounting surfaces abut each other when the assembly of memory module assembly 100C is completed. As indicated in the lower portion of FIG. 8(A), lower heat-sink plate 130C includes an elongated mounting surface 137C that extends along the entire length of base structure 131C. Because upper heat-sink plate 140C is substantially identical to lower heat-sink plate 130C, upper heat-sink plate 140C includes a corresponding elongated mounting surface 147C that extends along the entire length of base structure 141C. As indicated in FIG. 8(B), when assembly 100C is completed, mounting surfaces 137C and 147C abut each other, thereby providing stability to the resulting structure.

Figure 9A:
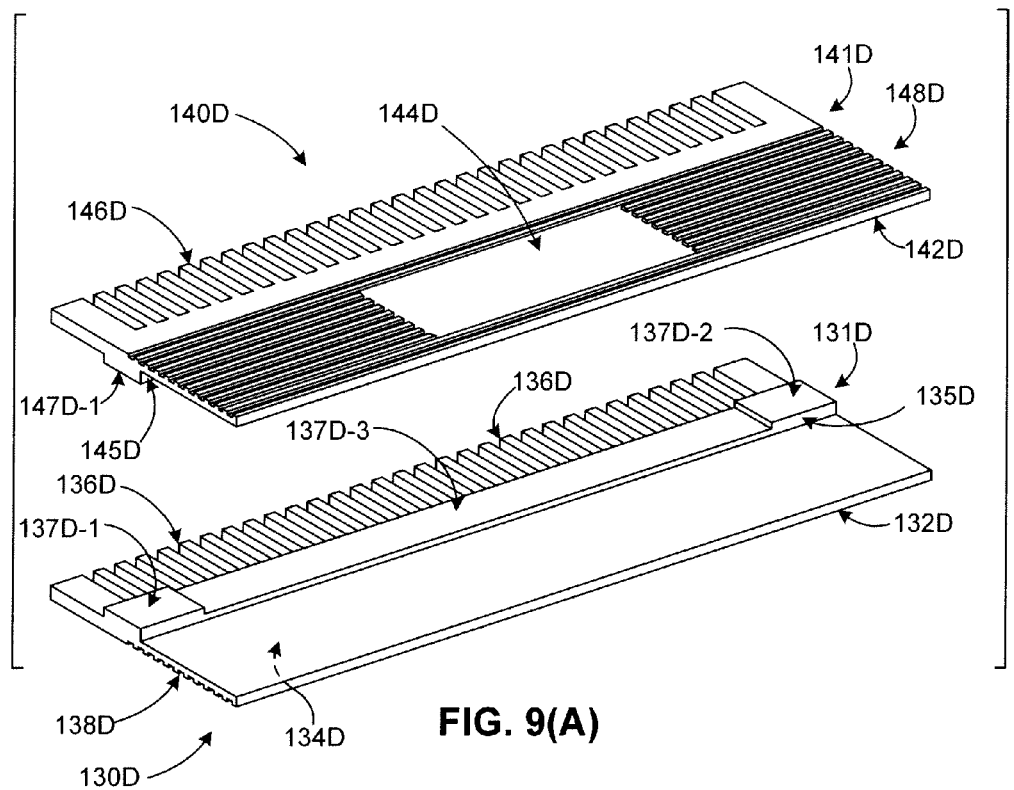
FIGS. 9(A) and 9(B) are exploded perspective and front assembled perspective views, respectively, showing a DDR2/DDR3 type memory module assembly according to another embodiment of the present invention.
Figure 9B:
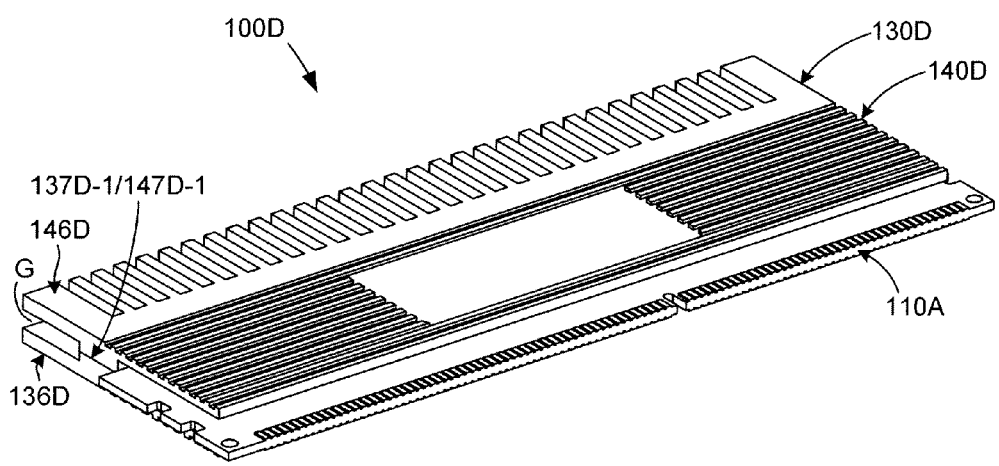

FIGS. 9(A) and 9(B) are exploded perspective and assembled perspective views showing a DDR-DIMM-type memory module assembly 100D according to another embodiment of the present invention. As indicated in FIG. 9(A), memory module assembly 100D includes a lower heat-sink plate 130D and an upper heat-sink plate 140D, which comprise substantially identical structures. Omitted from FIG. 9(A) for clarity are DDR PCBA 110A (discussed above) and adhesive portions that are mounted between opposing sides of PCBA 110A and lower heat-sink plate 130D and upper heat-sink plate 140D, respectively, in the manner described above.

Similar to heat-sink portions 130C and 140C (described above), lower heat-sink plate 130D and upper heat sink plate 140D are substantially identical structures that respectively include base structure 131D and 141D, contact plates 132D and 142D extending therefrom such that step-like positioning surfaces 135C and 135D are formed, and corresponding rows of heat-exchange fins 136D and 146D. Each outward facing surface 134D and 144D of contact plates 132D and 142D include ridges 138D and 148D, respectively.

In accordance with the present embodiment, each heat-sink plate 130D and 140D includes mounting structures respectively disposed at opposing ends of the base structure. For example, referring to the lower portion of FIG. 9(A), lower heat-sink plate 130D includes a first mounting structures 137D-1 and a second mounting structure 137D-2 that are disposed at opposite ends of base structure 132D, and are separated by a recessed central region 137D-3. Because upper heat-sink plate 140D is substantially identical to lower heat-sink plate 130D, upper heat-sink plate 140D includes a corresponding mounting structures (e.g., structure 147D-1 and a second structure obscured by upper heat-sink plate 140D) separated by a corresponding recessed region. As indicated in FIG. 9(B), when assembly 100D is completed, the corresponding mounting structures (e.g., structures 137D-1 and 147D-1) abut each other, thereby providing stability to the resulting structure. Note that the corresponding recessed regions (e.g., recessed region 137D-3) combine to form an air gap (not shown) between the abutting pairs of first and second mounting structures, whereby air is allowed to flow between heat-sink plates 130D and 140D, thus helping to cool assembly 100D during operation.

Although each of the above embodiments includes lower and upper heat-sink plates that contact each other to provide stability, it is also possible to provide heat sink plates having the novel features of the present invention that do not abut each other.

Figure 10A:
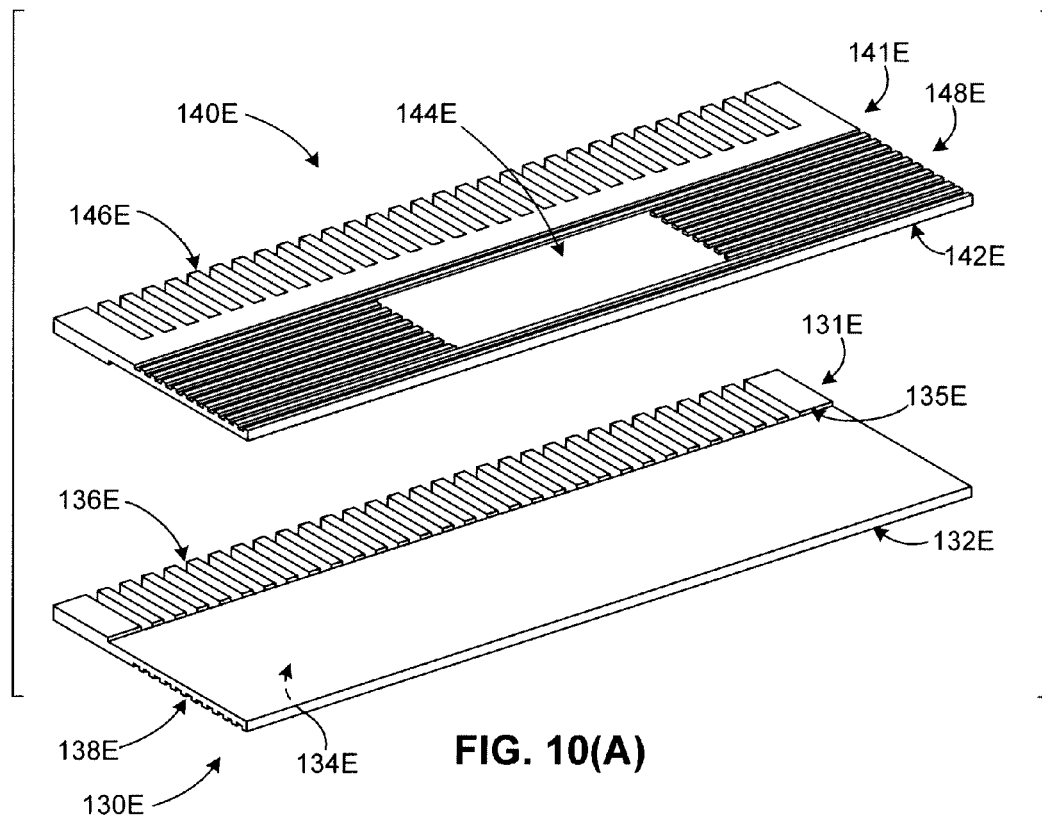
FIGS. 10(A) and 10(B) are exploded perspective and front assembled perspective views, respectively, showing a DDR2/DDR3 type memory module assembly according to another embodiment of the present invention.
Figure 10B:
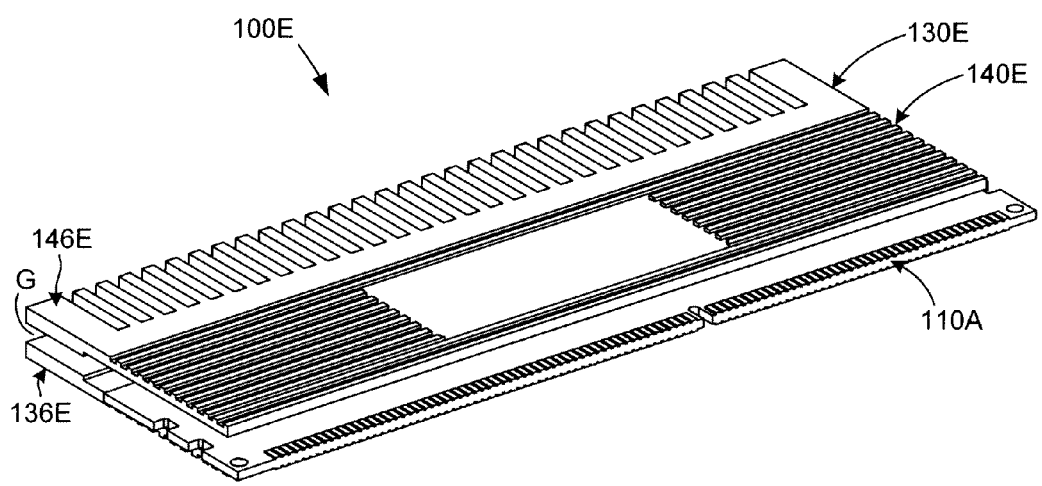

FIGS. 10(A) and 10(B) are exploded perspective and assembled perspective views showing a DDR-DIMM-type memory module assembly 100E according to another embodiment of the present invention in which a lower heat-sink plate 130D and an upper heat-sink plate 140D do not abut each other. Similar to heat-sink portions 130C and 140C (described above), lower heat-sink plate 130E and upper heat sink plate 140E are substantially identical structures that respectively include base structure 131E and 141E, contact plate 132E and 142E, corresponding rows of heat-exchange fins 136E and 146E. Each outward facing surface 134E and 144E of contact plates 132E and 142E include ridges 138E and 148E, respectively. However, in the present embodiment, each heat-sink plate 130E and 140E are substantially flat (i.e., omit protruding mounting structures) such that the step-like positioning surfaces (e.g., positioning surface 135E) are relatively short in comparison to previous embodiments, and such that when assembled as shown in FIG. 10(B), heat-sink plates 130E and 140E remain entirely separated by PCBA 110A (i.e., an air gap G is defined along the entire length of heat-sink plates 130E and 140E such that fins 136E are separated from fins 146E), thereby providing more air flow to help the cooling process.

Several other embodiments are contemplated by the inventors. For example the heat sink may be made from a variety of heat-conducting materials such as aluminum, aluminum alloy, copper, brass, bronze, stainless steel, etc.

Figure 11:
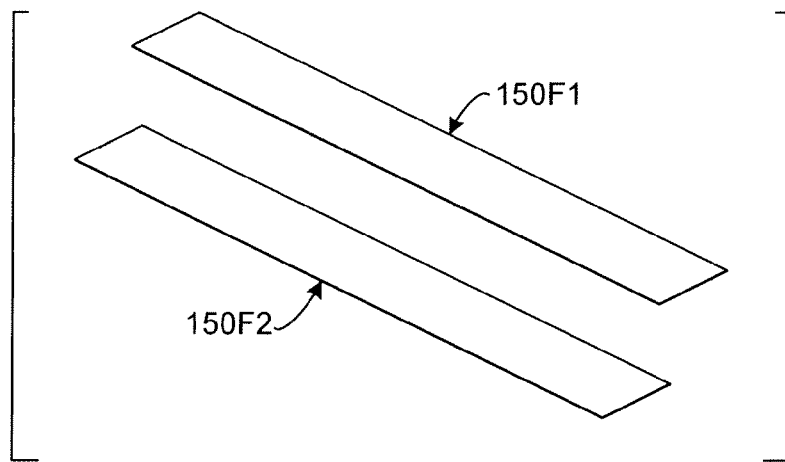
FIG. 11 is a simplified perspective view showing adhesive layers associated with DDR2/DDR3 type memory module assembly according to another embodiment of the present invention.
Figure 12:
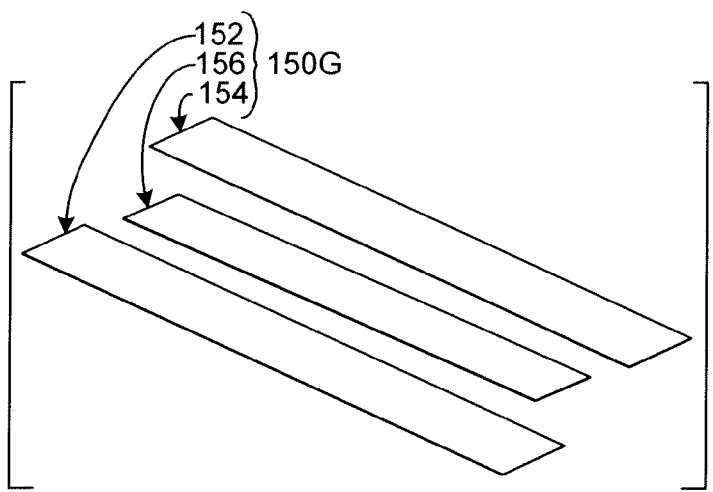
FIG. 12 is a simplified perspective view showing adhesive layers associated with DDR2/DDR3 type memory module assembly according to another embodiment of the present invention.
Figure 13:
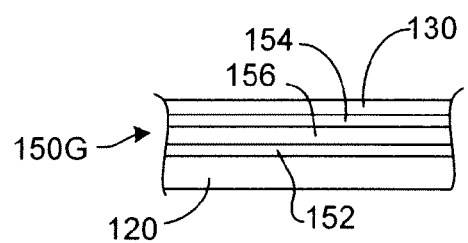
FIG. 13 is a cross-section side view showing the adhesive layers of FIG. 12 attached to a DDR2/DDR3 type memory module assembly.

In addition, the adhesive arrangements utilized in the embodiments described above are intended to be exemplary, and may be altered to facilitate better adherence and/or heat transfer characteristics of the resulting memory module assembly. For example, FIG. 11 shows upper and lower thermal-bond adhesive films or thermal paste layers 150F1 and 150F2 that may be respectively disposed between the heat-sink plates and PCBA in accordance with an alternative embodiment. Alternatively, as shown in FIGS. 12 and 13, a laminated adhesive structure 150G may be utilized to secure, for example, IC devices 120 to upper heat-sink plate 130. In the disclosed embodiment, laminated adhesive structure 150G includes a lower adhesive film 152, an upper adhesive film 154, and a thermal paste layer 156 disposed between the upper and lower adhesive films.

Figure 14:
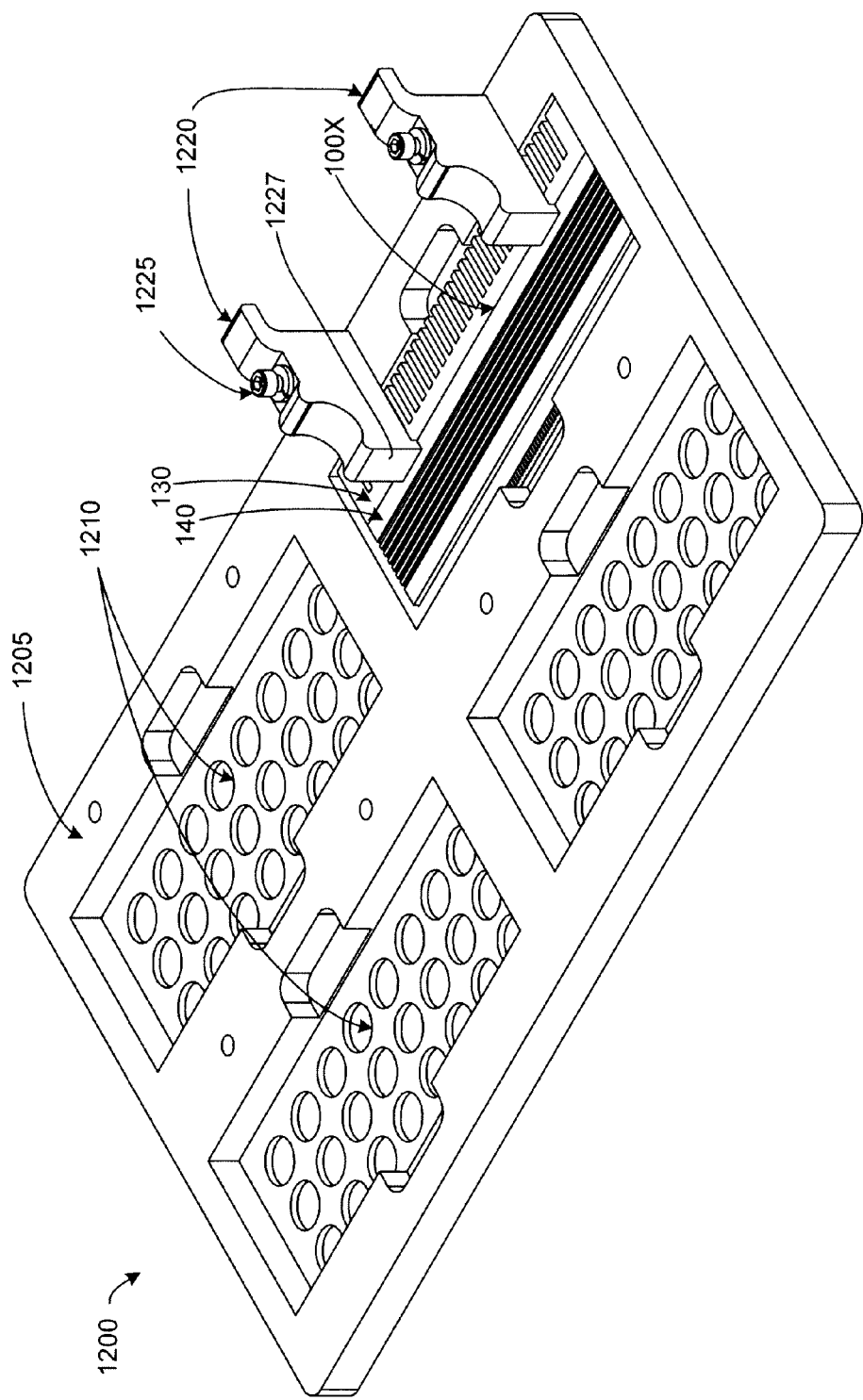
FIG. 14 is a perspective view showing a heat treatment fixture according to another embodiment of the present invention.

FIG. 14 is a perspective view showing a heat-sink reflow fixture 1200 utilized in a process for assembling DDR-DIMM memory modules 100X (i.e., any of the modules described above with reference to FIGS. 6-10) according to another embodiment of the present invention. The memory modules assembled using fixture 1200 may include any of the modules described in the embodiments set forth above. Fixture 1200 includes a base 1205 defining a plurality of recesses 1210 for receiving DDR-DIMM memory modules 100x in the depicted manner. Two spring clamps 1220 are mounted onto base 1205 and include adjustment screws 1225 that, when turned, press contact points 1227 against heat-sink plate 130 or heat-sink plate 140 of memory module 100X, thereby securing memory module 100X in a fixed manner for heat treatment. Although four recesses 1210 are shown, the number of recesses may be increased or decreased to maximize the efficiency of the heat treatment process.

Figure 15:
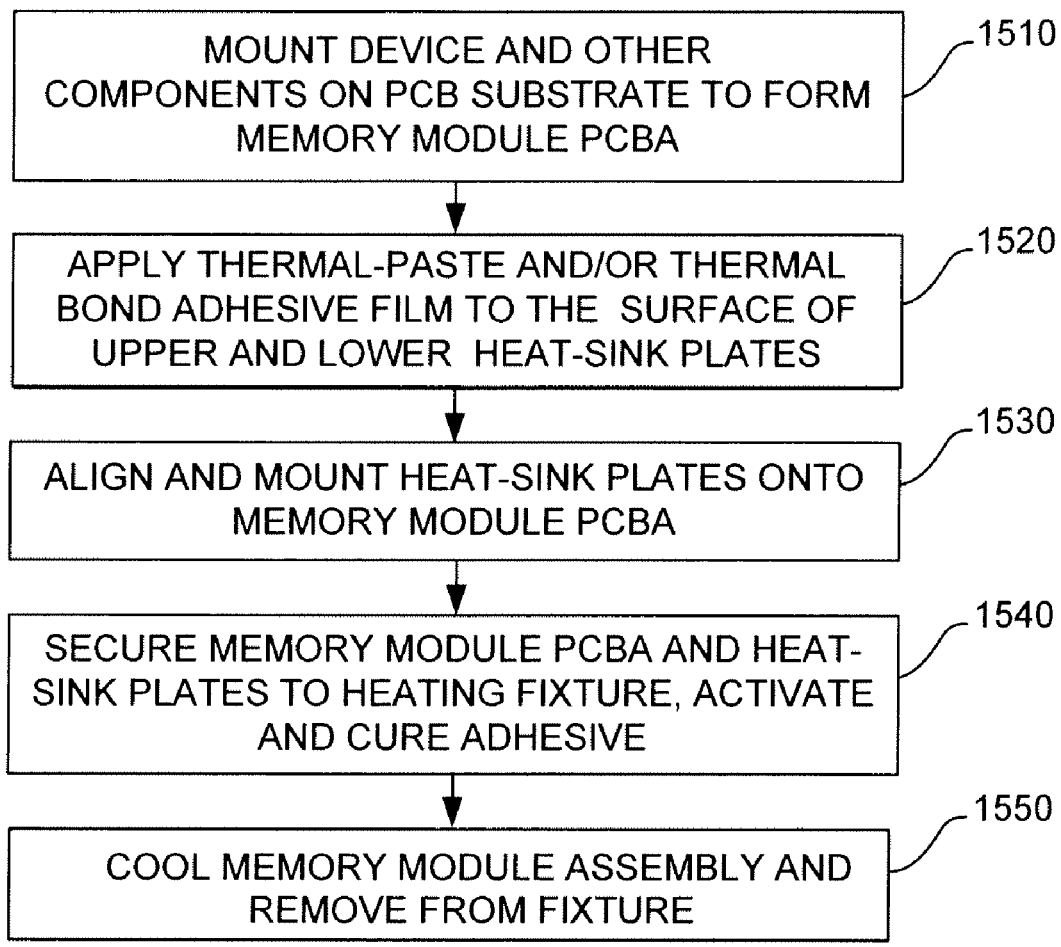
FIG. 15 is a flow diagram showing a process for manufacturing DDR2/DDR3 type memory module assemblies according to another embodiment of the present invention.

FIG. 15 is a flow diagram showing a process of assembling DDR-DIMM memory modules 100 utilizing heat-sink reflow fixture 1200 of FIG. 14. In block 1510, the various IC devices (e.g., memory devices) and other components are mounted onto the PCB substrate to form the memory module PCBA (e.g., PCBA 110A, discussed above). In block 1520, one or more of the adhesive portions describe above (e.g., thermal-bond adhesive film or thermally conductive material) are applied to the upper and lower heat-sink plates (e.g., heat-sink plates 130 and 140). The adhesive can be applied to the heat-sink surface by manual or automatic using dispensing machine. Next, immediately after dispensing the adhesive, the PCBA is mounted onto the lower heat-sink plate such that the second edge (i.e., the edge opposed to the contact edge) abuts the contact surface of the lower heat-sink plate, and then the upper heat-sink plate is mounted and aligned onto the memory module PCBA to form a memory module assembly using the methods described above (block 1530). In block 1540, the memory module assembly are mounted and secured by spring clamps 1220 into a corresponding recess 1210 of fixture 1200, and then the fixture is passed through an oven or otherwise subjected to an appropriate temperature (i.e., at or lower than the maximum safe operating temperature for the memory module components, e.g., 80° C. for approximately 15 minutes) to activate and/or cure the adhesive material. Finally, in block 1550, the memory module assembly is allowed to cool and is then removed from fixture 1200. For subsequent re-work to separate the PCBA from the heat-sink plates, the memory module assembly may be subjected to a temperature of about 150° C. for several seconds to remove the adhesives.

Figure 16:
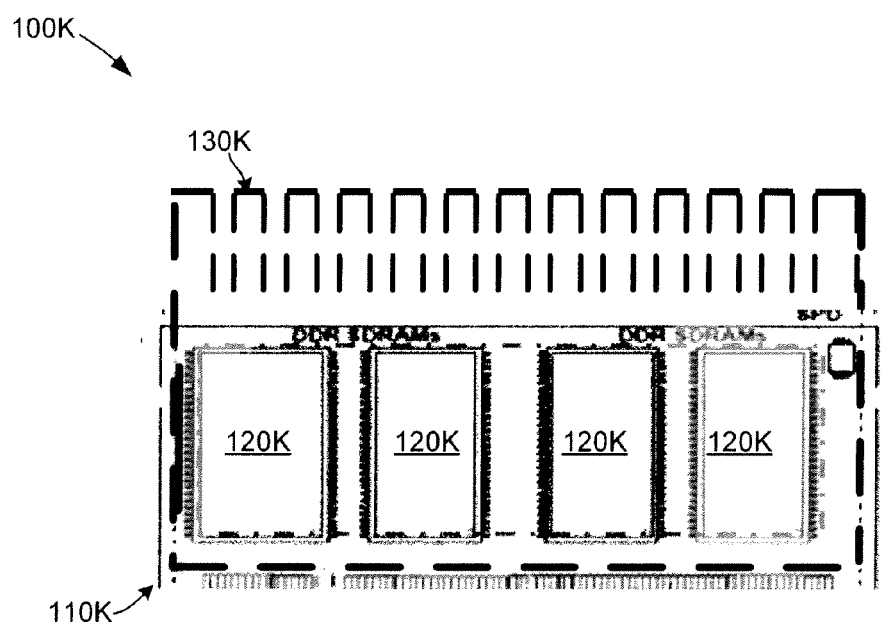
FIG. 16 is a simplified top plan view showing a DDR2/DDR3 type memory module assembly according to another embodiment of the present invention.
Figure 17:
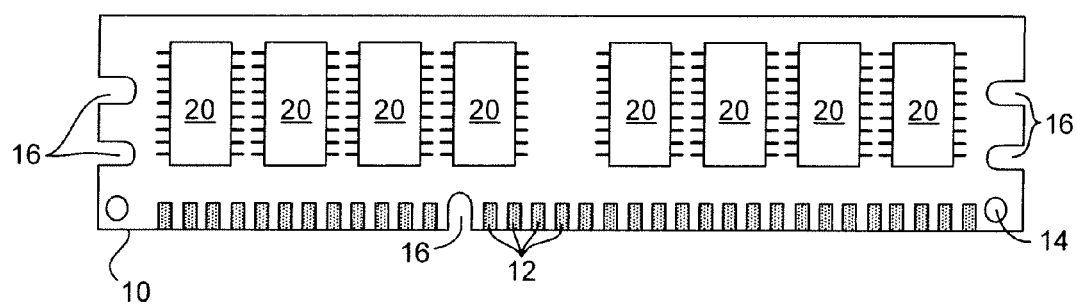
FIG. 17 is a top view showing a conventional memory module PCBA.

FIG. 16 is a modified top view showing a memory module assembly 100K according to yet another embodiment of the present invention. Memory module assembly 100K differs from previously described embodiments in that it includes a memory module PCBA 110K that is in the form of a Small Outline Dual Inline memory Module (SODIMM). This type of memory module is used mostly for notebook computers, with Thin Small Outline Package (TSOP). The number of memory devices 120K is typically reduced in half, with each side of memory module assembly 100K including a row of up to four devices. Adhesive is applied according to the previously described embodiments to the memory devices or the inside of the heat-sink plates (e.g., heat-sink plate 130K, which is constructed in the manner described above and shown in dashed lines for clarity), before the heat sink plates are attached to the memory module PCBA 110K. All the other features of memory module assembly 100K are similar to those described above. Further, in addition to the SODIMM arrangement shown in FIG. 16, the present invention may be incorporated into memory module assemblies including any of a Single Inline Memory Module (SIMM) device, a Dual Inline Memory Module (DIMM) device, Integrated Drive Electronics (IDE), Serial Advanced Technology Attachment (SATA) Solid State Drives (SSD), Compact Flash (CF), PCI Express, USB, Memory Stick, SD (Secure Digital) and MMC (Multi-Media Card).

Directional terms such as "upper", "side", "lower", "front", "outer" and "underside" are arbitrarily assigned herein as shown in the figures, and each term could refer to either surface of the module and/or heat-sink structure. Vias of through-holes may provide electrical connection between the surfaces or intermediate layers. These through-holes could be filled in holes or metal traces between layers rather than open holes, and can also be formed during the PCB processing as an integral part of the PCB. Various alternatives in geometries of the heat-sink plates and memory modules could be substituted.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A memory module assembly comprising:
  a memory module printed circuit board assembly (PCBA) including:
    a substrate having opposing first and second surfaces, a plurality of wiring traces formed on the first and second surfaces, at least some of the wiring traces being connected to metal contact pads formed along a connector edge of the substrate, the substrate having a second edge disposed opposite to the connector edge, and
    a plurality of first integrated circuit (IC) devices mounted on the first surface of the substrate such that an upper surface of each of the plurality of first IC devices faces away from the substrate;
  a first heat-sink plate mounted on the memory module PCBA, the first heat-sink plate including:
    an elongated first base structure,
    a first contact plate having a fixed edge connected to the base structure and a free edge disposed away from the base structure, the first contact plate having a first outer surface and an opposing first underside surface, wherein the first contact plate is disposed such that a step-like positioning surface is defined by the base structure and the first underside surface of the contact plate, and
    a plurality of heat-exchange fins extending from the first base structure; and
  at least one adhesive portion sandwiched between the first underside surface of the first heat-sink plate and the upper surface of an associated IC device of said plurality of first IC devices,
  wherein the memory module PCBA is positioned such that the second edge of the substrate contacts the positioning surface, and the connector edge of the substrate extends beyond the free edge of the contact plate,
  wherein the memory module PCBA further includes a plurality of second IC devices mounted on the second surface of the substrate such that an upper surface of each of the plurality of second IC devices faces away from the substrate,
  wherein the memory module assembly further comprises:
    a second heat-sink plate having a second outer surface and an opposing second underside surface; and
    at least one second adhesive portion sandwiched between the second underside surface of the second heat-sink plate and the upper surface of an associated IC device of said plurality of second IC devices,
  wherein the elongated base structure of the first heat-sink plate defines an elongated engaging groove, and
  wherein the second heat-sink plate includes an elongated engaging protrusion extending from the underside surface and received in said elongated engaging groove 2. The memory module assembly according to claim 1, wherein the plurality of heat-exchange fins comprises a first row of said heat-exchange fins and a second row of said heat-exchange fins separated by an elongated air gap.

3. The memory module assembly of claim 1, wherein each of said first and second adhesive portions comprise a heat-activated adhesive material exhibiting a first, relatively low adherence when heated to a first, relatively high temperature, and exhibiting a second, relatively high adherence when subsequently cooled to a second, relatively low temperature.

4. The memory module assembly according to claim 1, wherein each of the first and second adhesive portions comprises one of a high thermal conductive adhesive film and a thermal-bond adhesive film.

5. The memory module assembly according to claim 1, wherein the memory module PCBA comprises a dynamic random access memory (DRAM).

* * * * *